(12) United States Patent
Nguyen et al.

(10) Patent No.: US 10,481,653 B2
(45) Date of Patent: Nov. 19, 2019

(54) COMPOSITIONS HAVING A MATRIX AND ENCAPSULATED PHASE CHANGE MATERIALS DISPERSED THEREIN, AND ELECTRONIC DEVICES ASSEMBLED THEREWITH

(71) Applicant: Henkel IP & Holding GmbH, Duesseldorf (DE)

(72) Inventors: My N. Nguyen, Poway, CA (US); Jason Brandi, Laguna Hills, CA (US); Emilie Barriau, Duesseldorf (DE)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 15/143,869

(22) Filed: May 2, 2016

(65) Prior Publication Data

US 2016/0334844 A1    Nov. 17, 2016

Related U.S. Application Data

(63) Continuation of application No. PCT/US2014/070462, filed on Dec. 16, 2014.

(60) Provisional application No. 61/918,358, filed on Dec. 19, 2013.

(51) Int. Cl.
| | |
|---|---|
| *G06F 1/20* | (2006.01) |
| *H01L 23/373* | (2006.01) |
| *H01L 23/427* | (2006.01) |
| *H01L 23/552* | (2006.01) |
| *H01L 23/433* | (2006.01) |

(52) U.S. Cl.
CPC ............ *G06F 1/203* (2013.01); *H01L 23/373* (2013.01); *H01L 23/3733* (2013.01); *H01L 23/3737* (2013.01); *H01L 23/427* (2013.01); *H01L 23/4334* (2013.01); *H01L 23/552* (2013.01); *H01L 2924/0002* (2013.01)

(58) Field of Classification Search
CPC ......... H01L 2924/0002; H01L 2924/00; H01L 23/373; H01L 23/3737; H01L 23/427; H01L 23/4334; H01L 23/552; G06F 1/203
See application file for complete search history.

(56) References Cited

U.S. PATENT DOCUMENTS

| | | | |
|---|---|---|---|
| 4,979,019 A | 12/1990 | Paquette et al. | |
| 5,455,458 A * | 10/1995 | Quon | F28D 20/02 257/712 |

(Continued)

FOREIGN PATENT DOCUMENTS

| | | |
|---|---|---|
| CN | 101531855 A | 9/2009 |
| CN | 101585948 A | 11/2009 |

(Continued)

OTHER PUBLICATIONS

Smalc, M. et al. "Thermal Performance of Natural Graphite Heat Spreaders", Proc. IPACK2005, Interpack 2005-73073 (Jul. 2005), pp. 1-11.

(Continued)

*Primary Examiner* — Michael B Nelson
(74) *Attorney, Agent, or Firm* — Steven C. Bauman

(57) ABSTRACT

Provided herein are compositions made from a matrix and encapsulated phase change material particles dispersed therein, and electronic devices assembled therewith.

17 Claims, 7 Drawing Sheets

(56) References Cited

U.S. PATENT DOCUMENTS

| | | | |
|---|---|---|---|
| 5,738,936 A * | 4/1998 | Hanrahan | C08K 9/02 428/313.5 |
| 6,166,908 A | 12/2000 | Samaras et al. | |
| 6,191,478 B1 | 2/2001 | Chen | |
| 6,292,365 B1 | 9/2001 | Ashiwake et al. | |
| 6,482,520 B1 | 11/2002 | Tzeng | |
| 6,503,626 B1 | 1/2003 | Norley et al. | |
| 6,583,987 B2 | 6/2003 | Skinner et al. | |
| 6,735,378 B1 | 5/2004 | Kellerman et al. | |
| 6,982,874 B2 | 1/2006 | Smalc et al. | |
| 7,348,665 B2 | 3/2008 | Sauciuc et al. | |
| 7,608,324 B2 | 10/2009 | Nguyen et al. | |
| 7,643,284 B2 | 1/2010 | Nakamura | |
| 7,969,738 B2 | 6/2011 | Koo | |
| 8,003,028 B2 | 8/2011 | Lawton | |
| 8,242,602 B2 | 8/2012 | Fitzgerald et al. | |
| 8,296,942 B2 | 10/2012 | Feenstra | |
| 8,349,920 B2 | 1/2013 | Menning | |
| 8,391,065 B2 | 3/2013 | Noguchi | |
| 8,535,981 B2 | 9/2013 | Ko et al. | |
| 2001/0019745 A1 | 9/2001 | Beele et al. | |
| 2002/0050642 A1 | 5/2002 | Oota et al. | |
| 2003/0019604 A1 | 1/2003 | Ishiduka et al. | |
| 2003/0072134 A1 * | 4/2003 | Ishikawa | F28D 1/0308 361/679.48 |
| 2003/0157342 A1 | 8/2003 | Myers et al. | |
| 2003/0169568 A1 | 9/2003 | Tanaka | |
| 2003/0198022 A1 | 10/2003 | Ye et al. | |
| 2004/0008487 A1 * | 1/2004 | Hisano | H05K 7/20254 361/690 |
| 2004/0056348 A1 | 3/2004 | Nakanishi et al. | |
| 2004/0084764 A1 | 5/2004 | Ishimine et al. | |
| 2004/0241417 A1 * | 12/2004 | Fischer | B32B 5/18 428/317.9 |
| 2005/0030715 A1 | 2/2005 | Hirota et al. | |
| 2005/0214547 A1 | 9/2005 | Pasquier et al. | |
| 2005/0241817 A1 | 11/2005 | Moore et al. | |
| 2006/0007656 A1 | 1/2006 | Symons | |
| 2006/0086493 A1 | 4/2006 | Fujiwara et al. | |
| 2006/0174720 A1 | 8/2006 | Renken et al. | |
| 2007/0097651 A1 | 5/2007 | Canale et al. | |
| 2007/0176277 A1 | 8/2007 | Brunnbauer et al. | |
| 2007/0290392 A1 * | 12/2007 | Lawton | C04B 20/10 264/112 |
| 2008/0053640 A1 | 3/2008 | Mok | |
| 2008/0112130 A1 * | 5/2008 | Nakamura | G06F 1/203 361/679.49 |
| 2008/0151487 A1 | 6/2008 | Ni et al. | |
| 2009/0001372 A1 | 1/2009 | Airk et al. | |
| 2009/0161300 A1 | 6/2009 | Chou | |
| 2009/0161311 A1 | 6/2009 | Tseng-Shih | |
| 2009/0180257 A1 | 7/2009 | Park et al. | |
| 2009/0283902 A1 | 11/2009 | Bezama et al. | |
| 2010/0002399 A1 | 1/2010 | Mori et al. | |
| 2010/0055811 A1 | 3/2010 | Lin et al. | |
| 2010/0073864 A1 | 3/2010 | Hwang et al. | |
| 2010/0227198 A1 | 9/2010 | Lampenscherf | |
| 2010/0245716 A1 | 9/2010 | Mo et al. | |
| 2010/0277868 A1 | 11/2010 | Beaupre et al. | |
| 2011/0044002 A1 | 2/2011 | Jokelainen et al. | |
| 2011/0044369 A1 | 2/2011 | Andry et al. | |
| 2011/0101349 A1 * | 5/2011 | Oda | G01R 31/2884 257/48 |
| 2011/0110048 A1 | 5/2011 | Lima | |
| 2011/0157832 A1 | 6/2011 | Hongo | |
| 2011/0176280 A1 | 7/2011 | Lee | |
| 2011/0228583 A1 | 9/2011 | Noguchi et al. | |
| 2011/0316035 A1 | 12/2011 | Shin et al. | |
| 2012/0014068 A1 | 1/2012 | Nakanishi et al. | |
| 2012/0152297 A1 | 6/2012 | Mitchell et al. | |
| 2012/0153455 A1 | 6/2012 | Mizuno et al. | |
| 2012/0193076 A1 | 8/2012 | Sakamoto et al. | |
| 2012/0281360 A1 | 11/2012 | Nicol et al. | |
| 2012/0326292 A1 | 12/2012 | Ohashi et al. | |
| 2013/0058067 A1 | 3/2013 | Yee et al. | |
| 2014/0085911 A1 | 3/2014 | Zhang et al. | |

FOREIGN PATENT DOCUMENTS

| | | |
|---|---|---|
| CN | 102117110 A | 7/2011 |
| JP | H07-138520 A | 5/1995 |
| JP | 2000034117 A | 2/2000 |
| JP | 2000148306 A | 5/2000 |
| JP | 2000194454 A | 7/2000 |
| JP | 2001142575 A | 5/2001 |
| JP | 2001-308242 A | 11/2001 |
| JP | 2002319652 A | 10/2002 |
| JP | 2003027080 A | 1/2003 |
| JP | 2004197935 A | 7/2004 |
| JP | 2004241721 A | 8/2004 |
| JP | 2004537163 A | 12/2004 |
| JP | 2005530887 A | 10/2005 |
| JP | 2005-325348 A | 11/2005 |
| JP | 2006522491 A | 9/2006 |
| JP | 2009123769 A | 6/2009 |
| RU | 117056 U1 | 6/2012 |
| TW | 200841940 A | 11/2008 |
| TW | M407489 U1 | 7/2011 |
| TW | 201135881 A | 10/2011 |
| TW | 201135881 A1 | 10/2011 |
| TW | 201135884 A1 | 10/2011 |
| TW | 201200547 A | 1/2012 |
| TW | 201334641 A1 | 8/2013 |
| TW | I405281 B | 8/2013 |
| WO | 03067949 A1 | 8/2003 |
| WO | 2010074970 A2 | 7/2010 |
| WO | WO 2011/106771 * | 12/2011 |
| WO | 2013014718 A1 | 1/2013 |
| WO | 2013074409 A1 | 5/2013 |

OTHER PUBLICATIONS

Houtman, C. et al. "Properties of Water-based Acrylic Pressure Sensitive Adhesive Films in Aqueous Environments", 2000TAPPI Recycling Symposium, Washington, D.C. (Mar. 5-8, 2000).

Satas, Donatas. "Handbook of Pressure Sensitive Adhesive Technology", Van Nostrand, NY (1989).

Salunkhe, P.B. et al. "A review on effect of phase change material encapsulation on the thermal performance of a system", Renewable and Sustainable Energy Reviews, 16, 5603-16 (2012).

International Search Report Issued in connection with International Patent Application No. PCT/US2014/027031 dated Jul. 4, 2014.

Bajaj, P. et al. "Effect of Coupling Agents on Thermal and Electrical Properties of Mica/Epoxy Composites." Journal Applied Polymer Science, vol. 56, 1995, pp. 1339-1347.

* cited by examiner

COMPOSITIONS HAVING A MATRIX AND ENCAPSULATED PHASE CHANGE MATERIALS DISPERSED THEREIN, AND ELECTRONIC DEVICES ASSEMBLED THEREWITH

BACKGROUND

Field

Provided herein are compositions made from a matrix and encapsulated phase change material particles dispersed therein, and electronic devices assembled therewith.

Brief Description of Related Technology

Thermal management materials are well known for dissipating heat generated by the circuitry and fans placed at strategic locations within an electronic device also draw heat away from the circuitry, or thermal module. The excess heat is diverted away from the semiconductor package to a heat sink or the thermal module with a thermal interface material ("TIM"), oftentimes disposed between the semiconductor package and the heat sink or thermal module.

However, these strategies to manage generated heat have created new problems, as the hot air is directed away from the immediate environment of the semiconductor package toward the interior of the housing of the device.

More specifically, in a conventional laptop or notebook computer (shown in FIG. 2), a housing exists under which are the components below the keyboard (shown in FIG. 3). The components include a heat sink, a heat pipe (disposed above a CPU chip), a fan, a slot for the PCMIA card, a hard drive, a battery, and a bay for a DVD drive. The hard drive is disposed under the left palm rest and the battery under the right. Oftentimes, the hard drive operates at high temperatures, resulting in uncomfortable palm rest touch temperatures, despite the use of cooling components to dissipate this heat. This may lead to end user consumer discomfort due to hot temperatures attained at certain portions of the exterior of the device when the devices are used.

One solution to mute the high in use temperatures observed by the end user at the palm rest position, for instance, is to use natural graphite heat spreaders disposed at strategic locations. These heat spreaders are reported to distribute heat evenly while providing thermal insulation through the thickness of the material. One such graphite material is available commercially as eGraf® SpreaderShield™, from GrafTech Inc., Cleveland, Ohio [See M. Smalc et al., "Thermal Performance Of Natural Graphite Heat Spreaders", Proc. IPACK2005, Interpack 2005-73073 (July, 2005); see also U.S. Pat. No. 6,482,520.]

Alternative thermal management solutions are desirable and would be advantageous, as there is a growing need in the marketplace for ways in which to manage the heat generated by such semiconductor packages used in electronic devices so that end user consumers do not feel discomfort due to the generated heat when they are used. Balanced against this need is the recognition that designers of semiconductor chips will continue to reduce the size and geometry of the semiconductor chips and semiconductor packages but increase their computing capacity. The competing interests of size reduction and increased computing power make the electronic devices appealing for the consumer, but in so doing causes the semiconductor chips and semiconductor packages to continue to operate at elevated temperature conditions, and indeed increasing elevated temperature conditions. Accordingly, it would be advantageous to satisfy this growing need with alternative technologies to encourage the design and development of even more powerful consumer electronic devices, which have reduced "skin temperature" and as such are not hot to the touch in operation.

SUMMARY

Provided herein is a composition including a matrix within which is dispersed a plurality of encapsulated phase change material particles. The composition is capable of absorbing heat. As such, in use it may be disposed onto at least a portion of a surface of a heat spreading device constructed from conductive materials, such as metal or metal-coated polymeric substrate, or graphite or metal-coated graphite, examples of which include Cu, Al, and graphite, and Cu- or Al-coated graphite.

The matrix of the composition may be a resin based one, such as a pressure sensitive adhesive ("PSA"), as those adhesives are commonly referred to, or an acrylic emulsion.

Where the matrix is a PSA, the composition may be disposed onto at least a portion of a surface of a heat spreading device to provide both EMI shielding and to enhance thermal performance of such device.

The composition may also function as a thermal absorber film for use in a transfer tape format so that the composition may be applied to any location on the device that requires cooling, such as on the interior of an EMI shield. Desirably, in such use, the encapsulated phase change material is coated on at least a portion of the surface thereof with a metal coating.

Where the matrix is an acrylic emulsion, the composition may likewise be so dispersed. However, the carrier liquid of the emulsion is evaporated prior to placing the composition under operating conditions.

The composition may be disposed onto a substrate or between two substrates. The substrate(s) may serve as a support or may serve as a heat spreader, in which case the support may be constructed from a conductive material which is a metal or a metal-coated polymeric substrate, or graphite or a metal-coated graphite.

The composition may be used with an article, such as a power source like a battery module to dissipate heat generated by the power source during operation. That operating temperature may be as high as about 40° C. In this embodiment, a housing comprising at least one substrate having an interior surface and an exterior surface is provided over and/or about the article and on an interior facing surface thereof, and a composition comprising a plurality of encapsulated phase change material particles dispersed within a matrix disposed upon a substrate, which as noted above may serve as a support or provide thermal conductivity to aid in spreading the generated heat, is disposed on at least a portion of the interior surface of the at least one substrate. In one aspect the encapsulated phase change material particles may have a layer of a conductive material disposed on at least a portion of the surface of the particles. The conductive coating should be metallic such as Ag, Cu or Ni so as to provide an EMI shielding effect.

In an embodiment for use in a consumer electronic article of manufacture, a housing is provided which comprises at least one substrate having an interior surface and an exterior surface; a composition is provided which comprises a plurality of encapsulated phase change material particles dispersed within a matrix disposed upon a substrate, which as noted above may serve as a support or provide thermal conductivity to aid in spreading the generated heat, which layer is disposed on at least a portion of the interior surface of the at least one substrate; and at least one semiconductor package is provided which comprises an assembly comprising at least one of I.
   a semiconductor chip;
   a heat spreader; and
   a thermal interface material therebetween (also known as a TIM1 application)

II.
   a heat spreader;
   a heat sink; and
   a thermal interface material therebetween (also known as a TIM2 application).

Also, provided herein is a method of manufacturing such a consumer electronic device.

DETAILED DESCRIPTION

Figure 1:
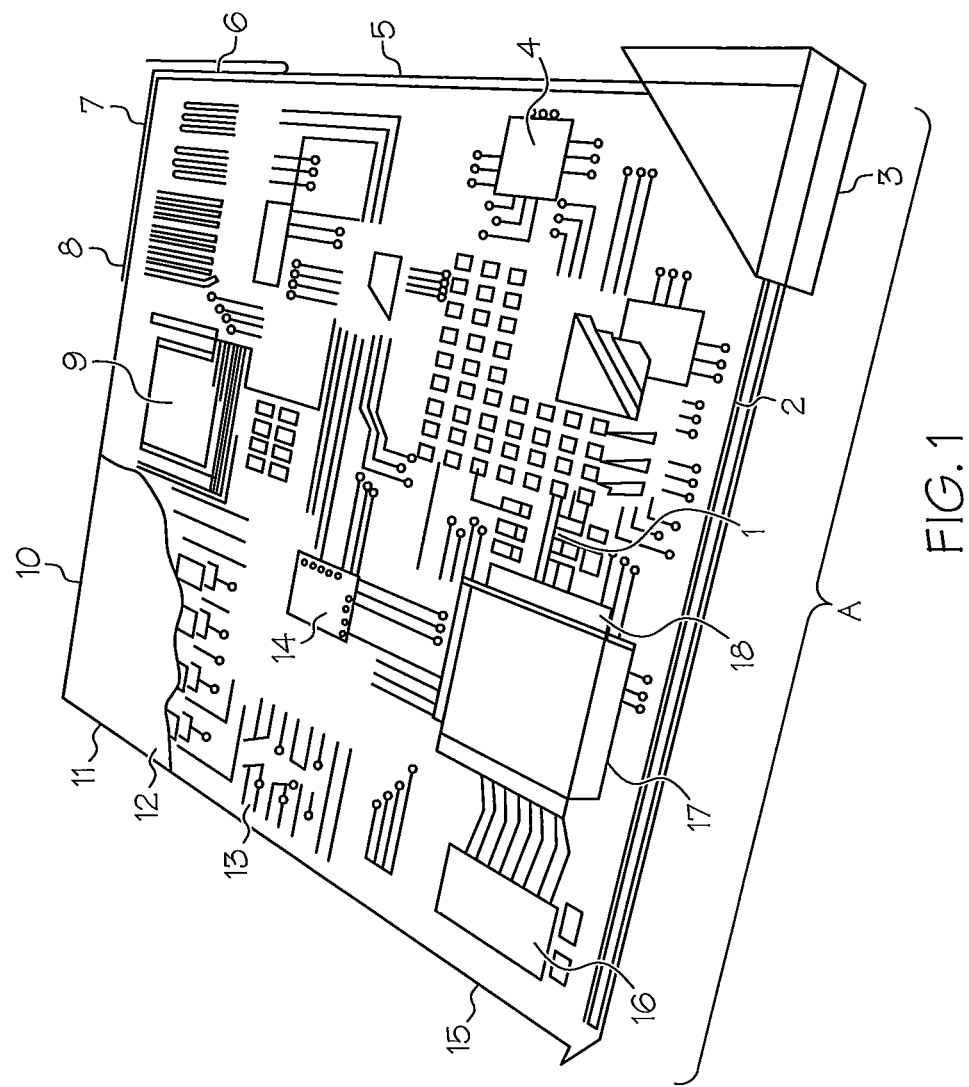
FIG. 1 depicts a cut away view of a circuit board on which is disposed a plurality of semiconductor packages and circuitry, together with electronic materials ordinarily used in the assembly of the packages themselves and the assembly of the packages onto the board. Reference numbers 1-18 refer to some electronic materials used in the packaging and assembly of semiconductors and printed circuit boards.

As noted above, provided herein is a composition including a matrix within which is dispersed a plurality of encapsulated phase change material particles. The composition may be disposed onto a substrate or between two substrates. The substrate(s) may serve as a support or may serve as a heat spreader, in which case the support may be constructed from a conductive material which is metal or metal-coated polymeric substrate, or graphite or a metal-coated graphite.

The composition comprises a matrix (such as a PSA or an acrylic emulsion), in which is dispersed an encapsulated PCM. Optionally, the composition may also include thermally insulative elements. In one embodiment, a metallic or graphite substrate may be used as a support on which the composition is disposed. In this way the metallic or graphite substrate may acts as a heat spreader to further dissipate heat.

The composition—i.e., the PSA in which is dispersed an encapsulated PCM—may be coated on a heat spreading device, such as a metal like Cu or Al, graphite, or a metal-coated graphite—to enhance thermal performance of such devices.

The composition may be coated on a heat spreading device to also provide EMI shielding as well as to enhance thermal performance of such devices.

In the form of a transfer tape, the composition as a thermal absorber film may be applied to any location that requires cooling, such as inside the EMI shield. See e.g. FIG. 6.

The composition may be used with an article, such as a power source like a battery module to dissipate heat generated by the power source during operation. That operating temperature may be as high as about 40° C. In this embodiment, a housing comprising at least one substrate having an interior surface and an exterior surface is provided over and/or about the article and on an interior facing surface thereof a composition comprising a plurality of encapsulated phase change material particles dispersed within a matrix disposed upon a substrate, which as noted above may serve as a support or provide thermal conductivity to aid in spreading the generated heat, is disposed on at least a portion of the interior surface of the at least one substrate. In one aspect the encapsulated phase change material particles may have a layer of a conductive material disposed on at least a portion of the surface of the particles. The conductive coating should be metallic, such as Ag, Cu or Ni, so as to provide an EMI shielding effect.

In an embodiment for use in a consumer electronic article of manufacture, a housing is provided which comprises at least one substrate having an interior surface and an exterior surface; a composition is provided which comprises a plurality of encapsulated phase change material particles dispersed within a matrix disposed upon a substrate, which as noted above may serve as a support or provide thermal conductivity to aid in spreading the generated heat, which layer is disposed on at least a portion of the interior surface of the at least one substrate; and at least one semiconductor package is provided which comprises an assembly comprising at least one of I.
   a semiconductor chip;
   a heat spreader; and
   a thermal interface material therebetween (also known as a TIM1 application)

II.
   a heat spreader;
   a heat sink; and
   a thermal interface material therebetween (also known as a TIM2 application).

The composition may be used in the assembly of a consumer electronic article of manufacture. This article of manufacture (or "device") may be selected from notebook personal computers, tablet personal computers or handheld devices, for instance, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, monitors, televisions, stereo equipment, set up boxes, set-top boxes, boom boxes, modems, routers, keyboards, mice, speakers, printers, and combinations thereof.

The device may also include a venting element to disperse heat generated from the semiconductor assembly away from the device.

Of course, the consumer electronic device is provided with a power source to energize the semiconductor package(s).

The semiconductor package may be formed with a die attach material disposed between a semiconductor chip and a circuit board to securely adhere the chip to the board. Wire bonding forms the electrical interconnection between the chip and the board. This die attach material is oftentimes a highly filled material with a thermosetting resin matrix. The matrix may be composed of epoxy, maleimide, itaconimide, nadimide and/or (meth)acrylate. The filler may be conductive or non-conductive. In some instances, the die attach material is thermally conductive, in which case it too aids in dissipating heat away from the semiconductor package. Representative commercially available examples of such die attach materials include QMI519HT from Henkel Corporation.

Alternatively, the semiconductor package may be formed with a semiconductor chip electrically connected to a circuit board with solder interconnects in a space therebetween. In that space an underfill sealant may be disposed. The underfill sealant will also have a thermosetting matrix resin, which like the die attach material may be composed of epoxy, maleimide, itaconimide, nadimide and/or (meth)acrylate. The underfill sealant is ordinarily also filled. However, the filler is generally non-conductive and used for the purpose of accommodating differences in the coefficients of thermal expansion of the semiconductor die and the circuit board. Representative commercially available examples of such underfill sealants include HYSOL FP4549HT from Henkel Corporation.

Once the semiconductor package has been positioned onto the circuit board and attached thereto oftentimes by a surface mount adhesive, a chip bonder, or chip scale package underfill sealant, the package may be overmolded with mold compound in order to protect the package from among other things environmental contaminants. The mold compound is oftentimes epoxy based, but may also contain benzoxazine and/or other thermoset resins. GR750 is an example of an epoxy mold compound, available commercially from Henkel Corporation, designed to improve thermal management in semiconductor devices.

Solder pastes are used at various portions on the circuit board to attach semiconductor packages and assemblies, in an electrically interconnected manner. One such solder paste is available commercially from Henkel Corporation under the tradename MULTICORE Bi58LM100. This lead free solder paste is designed for applications where thermal management is desirable.

To effectively manage the heat generated by semiconductor chips and semiconductor packages, a thermal interface material may be used with any heat-generating component for which heat dissipation is required, and in particular, for heat-generating components in semiconductor devices. In such devices, the thermal interface material forms a layer between the heat-generating component and the heat sink and transfers the heat to be dissipated to the heat sink. The thermal interface material may also be used in a device containing a heat spreader. In such a device, a layer of thermal interface material is placed between the heat-generating component and the heat spreader, and a second layer of thermal interface material is placed between the heat spreader and the heat sink.

The thermal interface material may be a phase change material, such as one commercially available from Henkel Corporation under the tradenames POWERSTRATE EXTREME, PowerstrateXtreme or PSX. Packaged as a free-standing film between two release liners and supplied as a die cut perform to match a wide variety of applications, this thermal interface material is a reworkable phase change material suitable for use for instance between a heat sink and variety heat dissipating components. The material flows at the phase change temperature, conforming to the surface features of the components. The thermal interface material when in the form of a phase change material has a melting point of approximately 51° C. or 60° C.

Upon flow, air is expelled from the interface, reducing thermal impedance, performing as a highly efficient thermal transfer material.

The thermal interface material may be constructed from (a) 60% to 90% by weight of paraffin; (b) 0% to 5% by weight of resin; and (c) 10% to 40% by weight of metal particle, such as an electrically-conductive filler. The electrically-conductive filler is ordinarily one selected from graphite, diamond, silver, and copper. Alternatively, the electrically-conductive filler may be aluminum, such as a spherical alumina.

The metal particles suitable for use in the thermal interface material may be fusible metal particles, typically low melting point metals or metal alloys used as solders. Examples of such metals include bismuth, tin, and indium, and may also include silver, zinc, copper, antimony, and silver coated boron nitride. In one embodiment the metal particles are selected from tin, bismuth, or both. In another embodiment, indium will also be present. Alloys of the above metals also can be used.

An eutectic alloy of tin and bismuth powder (melting point 138° C.), in a weight ratio of tin to bismuth of Sn48Bi52 may also be used, particularly in combination with indium powder (melting point 158° C.), in which the indium is present in a weight ratio of 1:1 with the Sn:Bi alloy.

The metal particles and/or alloys should be present in the composition in a range from 50 to 95 weight percent of the thermal interface material.

The thermal interface material may also be a thermal grease, such as one commercially available from Henkel Corporation under the trade designations TG100, COT20232-3611 or COT20232-36E1. TG100 is a thermal grease designed for high-temperature heat transfer. In use, TG100 is placed between heat generating devices and the surfaces to which they are mounted or other heat dissipating surfaces. This product delivers excellent thermal resistance, offers high thermal conductivity and virtually no evaporation over a wide operating temperature range. In addition, COT20232-36E1 and COT20232-36I1 are TIM1 type materials, designed in this instance for high power flip chip applications. These products contain a soft gel polymer or curable matrix, which after cure forms an interpenetrating network with a low melting point alloy therewithin. The low melting point alloy may be fusible metal solder particles, particularly those substantially devoid of added lead, comprising an elemental solder powder and optionally a solder alloy.

The thermal interface material in use should have a thermal impedance of less than 0.2 (° C. cm$^2$/Watt).

The housing comprises at least two substrates and oftentimes a plurality of substrates. The substrates are dimensioned and disposed to engage one another. In order to manage the heat that may emanate from the interior of a consumer electronic device, and control the so called "skin temperature", it is oftentimes desirable to place between the housing and the semiconductor devices that generate heat a thermal management solution.

Here, that solution is a heat absorbing and/or thermally insulating composition, which more specifically is a phase change material ("PCM") that has been encapsulated within a shell, dispersed within a matrix, such as a pressure sensitive adhesive. For a general review of encapsulated PCMB, see e.g. Pramod B. Salunkhe et al., "A review on effect of phase change material encapsulation on the thermal performance of a system", *Renewable and Sustainable Energy Reviews,* 16, 5603-16, (2012).

PCMs may be composed of organic or inorganic materials. For instance, organic materials useful in PCMs include paraffin, fatty acids, esters, alcohols, glycols, or organic eutectics. And petrolatum, beeswax, palm wax, mineral waxes, glycerin and/or certain vegetable oils may also be used. Inorganic materials useful in PCMs include salt hydrates and low melting metal eutectics. The paraffin may be a standard commercial grade and should include a paraffin wax having a melting point below about 40° C. Use of such a paraffin wax permits the matrix to transition from its solid to liquid state at a temperature below about 37° C. In addition to paraffin, as noted above, petrolatum, beeswax, palm wax, mineral waxes, glycerin and/or certain vegetable oils may be used to form a PCM. For instance, the paraffin and petrolatum components may be blended together such that the ratio of such components (i.e., paraffin to petrolatum) is between approximately 1.0:0 to 3.0:1% by weight. In this regard, as the petrolatum component is increased relative say to the paraffin component, the PCM should increase in softness.

Commercially available representative PCMs include MPCM-32, MPCM-37, MPCM-52 and Silver Coated MPCM-37, where the number represents the temperature at which the PCM changes phase from solid to liquid. Suppliers include Entropy Solutions Inc., Plymouth, Minn. whose PCMs are sold under the Puretemp tradename and Microtek Laboratories, Inc., Dayton, Ohio. Microtek describes the encapsulated PCMs as consisting of an encapsulated substance with a high heat of fusion. The phase change material absorbs and releases thermal energy in order to maintain a regulated temperature within a product such as textiles, building materials, packaging, and electronics. The capsule wall or shell provides a microscopic container for the PCM. Even when the core is in the liquid state, the capsules still act as a solid—keeping the PCM from "melting away."

The PCM itself should be such that a phase change from solid or non-flowable to liquid or flowable occurs within a given temperature range.

In order to select a PCM for a specific application, the operating temperature of the device should be matched to the transition temperature of the PCM. PCMs for use herein should have a melting range within the range of about 30° C. to about 100° C., and all 2° C. and 5° C. increments within that range. When the PCMs are to be used with power modules a melting temperature of less than about 40° C. is desirable as that is the temperature vicinity in which the power modules ordinarily operate. When the PCMs are to be used with computer processing units ("CPU") a melting temperature in the range of about 50° C. to about 90° C. is desirable as that is the temperature range in which the CPU ordinarily operate.

Advantageously, the melting point of the constituents used in the PCM is selected to be below the temperature at which the devices operate. In this regard, a PCM in which a paraffin component is used assumes a liquid state during the operation of the consumer electronic device, and only during such time as the device operates at such elevated temperatures. As a result, heat absorption and release is modulated between the liquid and solid states, respectively, across the operating temperature range of the consumer electronic device in which the present invention is placed. This assists in modulating the "skin" temperature of the consumer electronic device, so as to minimize the temperature that the end user experiences when the consumer electronic device is in use.

As the PCM matrix undergoes its phase transition from a solid to a liquid state, the matrix absorbs heat until the matrix is transformed into the liquid state, which in this case at the operating temperature of the consumer electronic device is ordinarily a gel like state.

As the PCM matrix changes from a liquid to a solid state; the liquid state releases the absorbed heat until the matrix is transformed into solid state.

The melting temperature of the PCM matrix should be in the desired operating temperature range of the consumer electronic device.

The PCM matrix should also have a high latent heat of diffusion.

The PCM matrix should not degrade after multiples freeze-melt cycles.

The PCMs are dispersed in a matrix, which may be a pressure sensitive adhesive ("PSA") or an acrylic emulsion. The PSA is ordinarily made from acrylic polymers, such as those having the following composition or those that can be prepared by polymerizing (i) an acrylic monomer which is an acrylic or methacrylic acid derivative (e.g. methacrylic acid ester) of the formula $CH_2=CH(R^1)(COOR^2)$, where $R^1$ is H or $CH_3$ and $R^2$ is a $C_{1-20}$, preferably $C_{1-8}$, alkyl chain and (ii) a monomer with a pendant reactive functional group, which is described in more detail herein below, and the amount of the monomer (ii) is from about 0.001 to about 0.015 equivalent per 100 g of the acrylic polymer. See e.g. C. Houtman et al., "Properties of Water-based Acrylic Pressure Sensitive Adhesive Films in Aqueous Environments", 2000*TAPPI Recycling Symposium*, Washington, D.C. (5-8 Mar. 2000).

For the polymerization process, the monomers of components (I) and (ii), where appropriate, are converted by radical polymerization into acrylic polymers. The monomers are chosen such that the resulting polymers can be used to prepare PSAs in accordance with D. Satas, "Handbook of Pressure Sensitive Adhesive Technology", van Nostrand, NY (1989).

Examples of acrylates and/or methacrylates useful as components of monomer mixture (i) include methyl acrylate, ethyl acrylate, ethyl methacrylate, methyl methacrylate, n-butyl acrylate, n-butyl methacrylate, n-pentyl acrylate, n-hexyl acrylate, n-heptyl acrylate, and n-octyl acrylate, n-nonyl acrylate, lauryl methacrylate, cyclohexyl acrylate, and branched (meth)acrylic isomers, such as i-butyl acrylate, i-butyl methacrylate, n-butyl methacrylate, 2-ethylhexyl acrylate, stearyl methacrylate, and isooctyl acrylate.

The exemplary acrylic monomer mixture (i) has a Tg value less than 0° C. and a weight average molecular weight from about 10,000 to about 2,000,000 g/mol, such as between 50,000 and 1,000,000 g/mol and desirably between 100,000 and 700,000 g/mol. The mixture (i) may be a single monomer provided that it has a homopolymer Tg of less than 0° C.

Examples of suitable monomer (ii) are those capable of providing green strength to the adhesive films, include cycloaliphatic epoxide monomers M100 and A400 (Daicel), oxetane monomer OXE-10 (available commercially from Kowa Company), dicyclopentadienyl methacrylate epoxide (CD535, available commercially from Sartomer Co., Exton, Pa.), and 4-vinyl-1-cyclohexene-1,2-epoxide (available commercially from Dow).

The acrylic polymers are capable of undergoing post-UV cationic activated reaction and thus, provide high temperature holding strength to the adhesive films. The acrylic polymers are those having the following composition or those that can be prepared by polymerizing (i) an acrylic monomer which is an acrylic or methacrylic acid derivative of the formula $CH_2=CH(R_1)(COOR_2)$, where $R_1$ is H or $CH_3$ and $R_2$ is $C_{1-20}$ alkyl chain and (ii) a monomer with a combination of pendant reactive functional groups selected from both (1) cycloaliphatic epoxide, oxetane, benzophenone or mixtures thereof, and (2) mono-substituted oxirane. The amount of monomer (ii) is about 0.001 to about 0.015 equivalent per 100 g of the acrylic polymer. The acrylic polymer is essentially free of multi-(meth)acrylate, polyol or OH-functional groups and the polymer remains substantially linear after polymerization. In a more preferred embodiment, the amount of the monomer (ii) is from about 0.002 to about 0.01 equivalent per 100 g of the acrylic polymer.

The acrylic polymers prepared generally have a weight averaged average molecular weight ($M_w$) of from 10,000 to 2,000,000 g/mol, such as between 50,000 and 1,000,000 g/mol, like between 100,000 and 700,000 g/mol. $M_w$ is determined by gel permeation chromatography or matrix-assisted laser desorption/ionization mass spectrometry.

Examples of mono-substituted oxiranes useful as monomer (ii) include glycidyl methacrylate, 1,2-epoxy-5-hexene, 4-hydroxybutylacrylate glycidyl ether, cycloaliphatic epoxide monomer M100 and A400, OXE-10, CD535 epoxide, and 4-vinyl-1-cyclohexene-1,2-epoxide.

The PSA may also comprise various other additives, such as plasticizers, tackifiers, and fillers, all of which are conventionally used in the preparation of PSAs. As plasticizers to be added, low molecular weight acrylic polymers, phthalates, benzoates, adipates, or plasticizer resins, are but a few possibilities. As tackifier or tackifying resins to be added, it is possible to use any known tackifying resins described in the literature. Non-limiting examples include pinene resins, indene resins, and their disproportionated, hydrogenated, polymerized, and esterified derivatives and salts, the aliphatic and aromatic hydrocarbon resins, terpene resins, terpene-phenolic resins, $C_5$ resins, $C_9$ resins, and other hydrocarbon resins. Any desired combinations of these or other resins may be used in order to adjust the properties of the resultant adhesive in accordance with the desired final properties.

The PSAs may further be blended with one or more additives such as aging inhibitors, antioxidants, light stabilizers, compounding agents, and/or accelerators.

Commercial representative examples of suitable PSAs include those available from Henkel Corporation under the trade name DUROTAK.

The inventive compositions include:
a matrix, such as in an amount of 10% to 80% by volume; and
encapsulated PCM, such as in an amount of 20% to 90% by volume; and
optionally, thermally insulative elements.

It may be desirable to include thermal insulating elements to the encapsulated PCM-containing matrix. Representative commercially available examples of such thermal insulators include hollow sphere-like vessels, such as those sold under the DUALITE tradename by Henkel Corporation or the EXPANCEL tradename by Akzo Nobel, such as DUALITE E. DUALITE E is promoted to lower the thermal conductivity of the final product in which it is used as cost reducing or weight saving component. Using DUALITE E is reported to introduce stable, hollow, closed-cell voids into the final product.

In addition, solid materials having porosity or interstices in which gas is disposed may be used as an alternative to or in combination with the hollow sphere-like vessels. The thermally insulating elements in this regard may comprise a gas disposed within interstices of a substantially solid sphere-like particle. Representative commercially available examples of such thermally insulating elements include those sold under the AEROGEL NANOGEL tradename by Degussa Corporation. They are described by the manufacturer as lightweight, insulating silica materials, composed of a lattice network of glass strands with very small pores, composed from up to 5% solids and 95% air. This structure, it is reported, creates superior insulating, light transmitting and water repelling properties. The silica materials are a nanoporous silica with an average pore size of 20 nanometers. The small pore size and structure traps the flow of air to prevent heat loss and solar heat gain.

When used, the thermal insulating element(s) are disposed in a matrix at a concentration of 25% to 99% by volume in the matrix to form a heat absorbing and/or thermally insulating composition.

The inventive composition may be disposed as a layer or coating on at least a portion of the surface of the substrate. The so-formed coating is thick enough to aid in creating a barrier to heat transmission through the substrate from the heat generated from the semiconductor packages when in use, but not so thick so as to interfere with the assembly and/or operation of the consumer electronic device.

Figure 2:
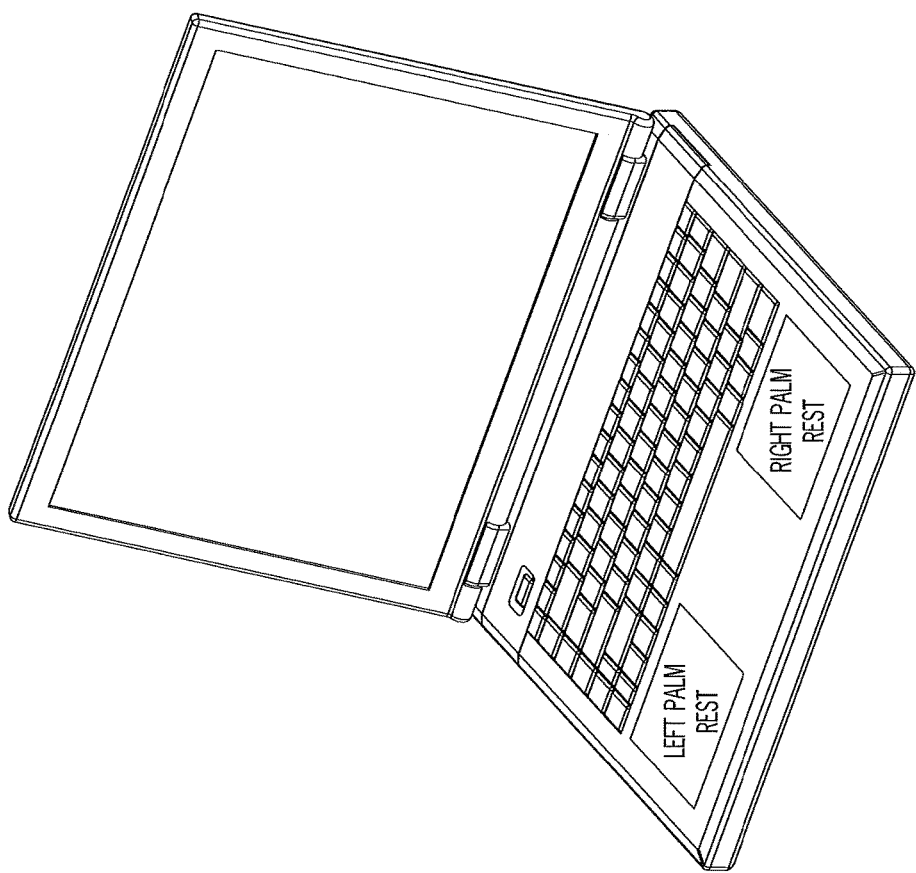
FIG. 2 depicts a laptop personal computer in the open position.
Figure 3:
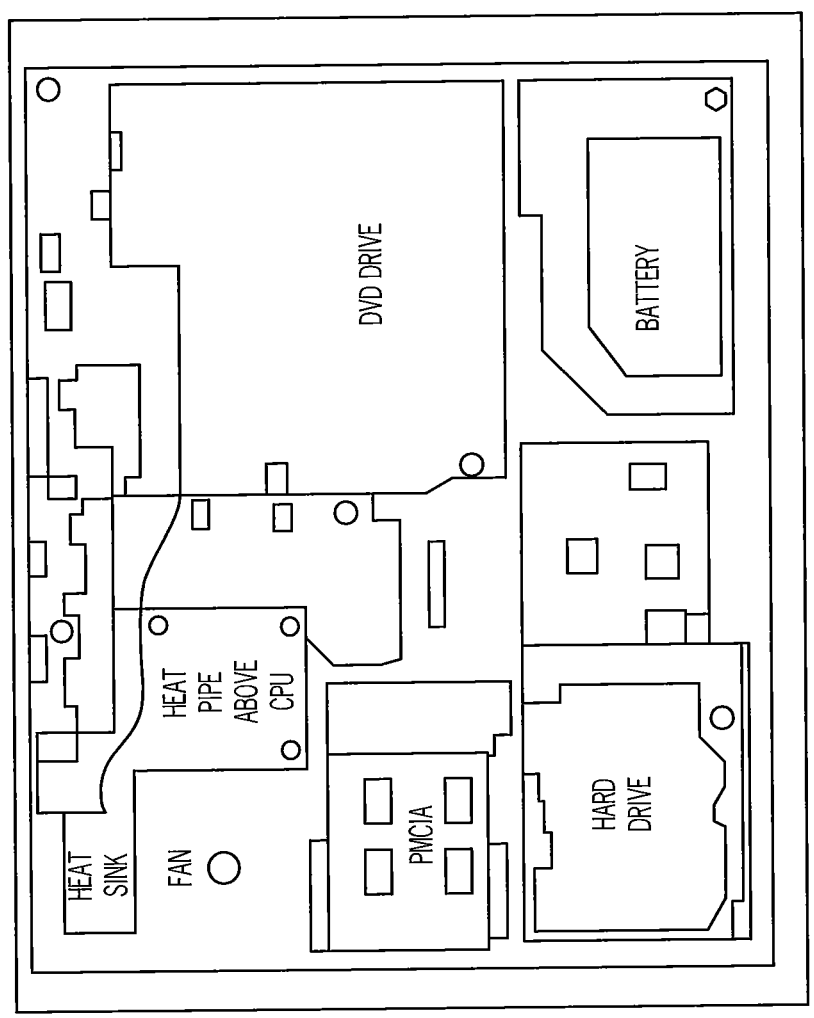
FIG. 3 depicts a top view of the contents of the laptop personal computer, beneath the keyboard and palm rests thereof.

The inventive compositions should be disposed on at least a portion of the interior surface of the at least one substrate that comprises the housing, the complementary exterior surface of which comes into contact with the end user when in use. So, with reference to FIG. 2, palm rests would be good examples of this location on a lap top or notebook personal computer.

With reference to FIG. 1, a cut way view of a circuit board is shown. On the circuit board is disposed a plurality of semiconductor packages and circuitry, together with electronic materials ordinarily used in the assembly of the packages themselves and the assembly of the packages onto the board, and a portion of the housing of the electronic device in which the circuit board is to be used. In FIG. 1, 1 refers to surface mount adhesives (such as LOCTITE 3609 and 3619); 2 refers to thermal interface materials, as described in more detail herein; 3 refers to low pressure molding materials (such as MM6208); 4 refers to flip chip on board underfill such as HYSOL FP4531); 5 refers to liquid encapsulants glob top (such as HYSOL E01016 and E01072); 6 refers to silicone encapsulants (such as LOCTITE 5210); 7 refers to gasketing compounds (such as LOCTITE 5089); 8 refers to a chip scale package/ball grid array underfill (such as HYSOL UF3808 and E1216); 9 refers to a flip chip air package underfill (such as HYSOL FP4549 HT); 10 refers to coating powder (such as HYSOL DK7-0953M); 11 refers to mechanic molding compound (such as HYSOL LL-1000-3NP and GR2310); 12 refers to potting compound (such as E&C 2850FT); 13 refers to optoelectronic (such as Ablestik AA50T); 14 refers to die attach (such as Ablestick 0084-1LM1SR4, 8290 and HYSOL OMI529HT); 15 refers to conformal coating (such as LOCTITE 5293 and PC40-UMF); 16 refers to photonic component and assembly materials (such as STYLAST 2017M4 and HYSOL OT0149-3); 17 refers to semiconductor mold compound; and 18 refers to solder (such as Multicore BI58LM100AAS90V and 97SCLF318AGS88.5). Each of these products is available for sale commercially from Henkel Corporation, Irvine, Calif.

The circuit board A of FIG. 1 is disposed within the interior of the housing of an electronic device (not shown). On at least a portion of an inwardly facing surface of a substrate which comprises the housing of the electronic device is coated a layer of thermally insulating elements (not shown).

Figure 4:
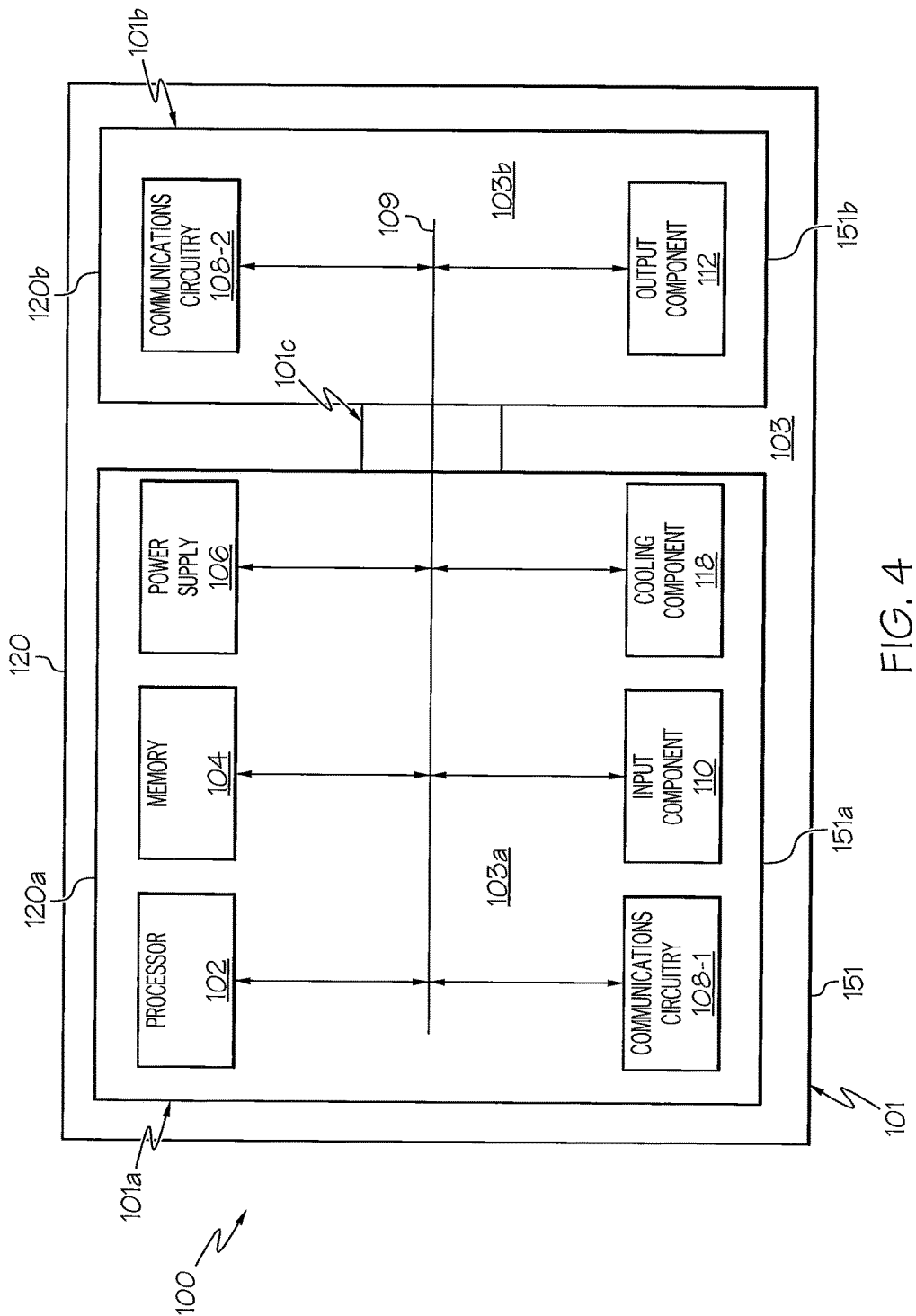
FIG. 4 depicts a general schematic diagram of an electronic device.
Figure 5:
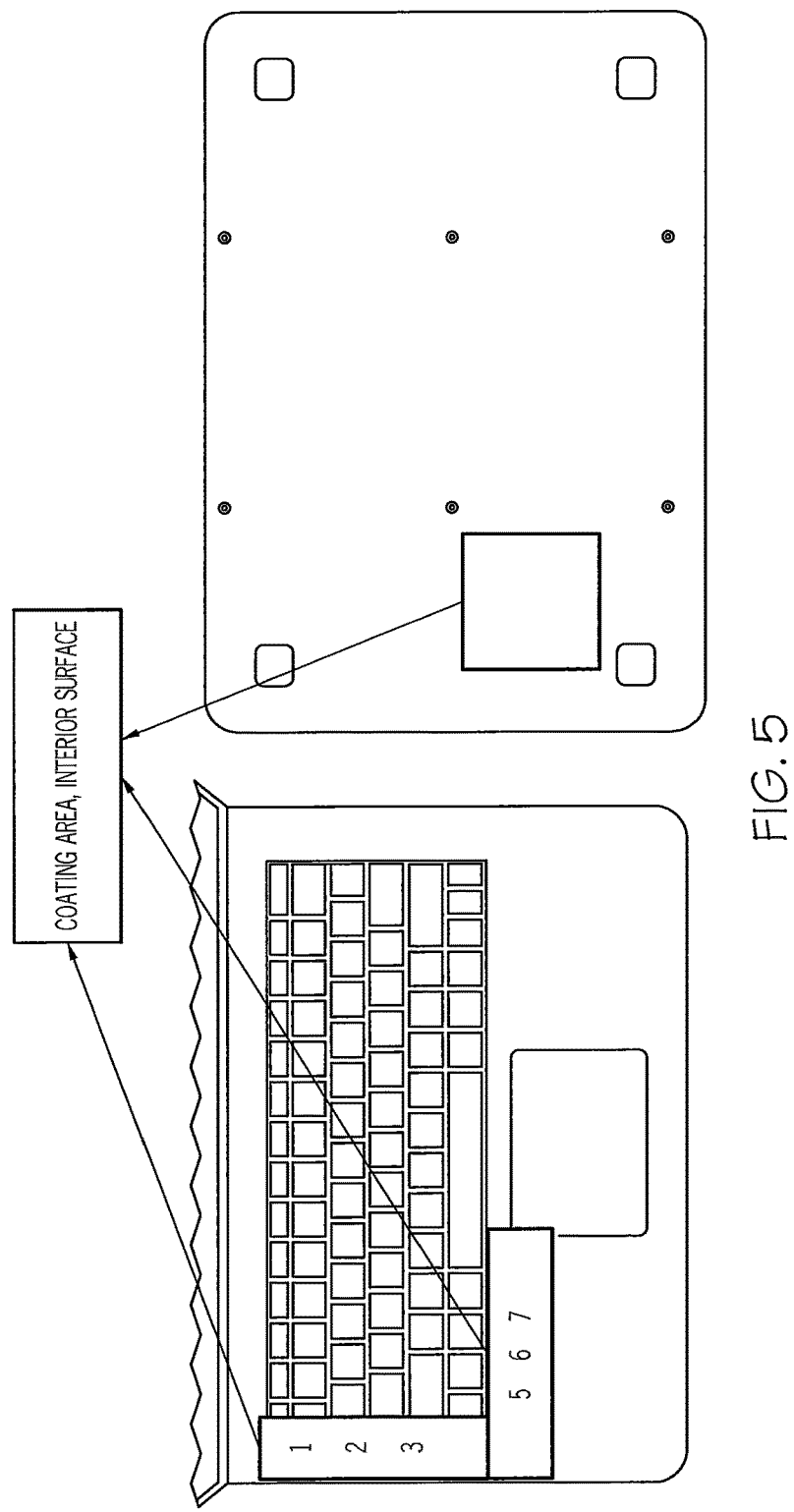
FIG. 5 depicts a plan view of the locations for skin temperature measurements in a tablet.

As shown in FIG. 4, electronic device 100 may include housing 101, processor 102, memory 104, power supply 106, communications circuitry 108-1, bus 109, input component 110, output component 112, and cooling component 118. Bus 109 may include one or more wired or wireless links that provide paths for transmitting data and/or power, to, from, or between various components of electronic device 100 including, for example, processor 102, memory 104, power supply 106, communications circuitry 108-1, input component 110, output component 112, and cooling component 118.

Memory 104 may include one or more storage mediums, including, but not limited to, a hard-drive, flash memory, permanent memory such as read-only memory ("ROM"), semi-permanent memory such as random access memory ("RAM"), any other suitable type of storage component, and any combinations thereof. Memory 104 may include cache memory, which may be one or more different types of memory used for temporarily storing data for electronic device applications.

Power supply 106 may provide power to the electronic components of electronic device 100, either by one or more batteries or from a natural source, such as solar power using solar cells.

One or more input components 110 may be provided to permit a user to interact or interface with device 100, such as by way of an electronic device pad, dial, click wheel, scroll wheel, touch screen, one or more buttons (e.g., a keyboard), mouse, joy stick, track ball, microphone, camera, video recorder, and any combinations thereof.

One or more output components 112 can be provided to present information (e.g., textual, graphical, audible, and/or tactile information) to a user of device 100, such as by way of audio speakers, headphones, signal line-outs, visual displays, antennas, infrared ports, rumblers, vibrators, and any combinations thereof.

One or more cooling components 118 can be provided to help dissipate heat generated by the various electronic components of electronic device 100. These cooling components 118 may take various forms, such as fans, heat sinks, heat spreaders, heat pipes, vents or openings in housing 101 of electronic device 100, and any combinations thereof.

Processor 102 of device 100 may control the operation of many functions and other circuitry provided by device 100. For example, processor 102 can receive input signals from input component 110 and/or drive output signals through output component 112.

Housing 101 should provide at least a partial enclosure to one or more of the various electronic components that operate electronic device 100. Housing 100 protects the electronic components from debris and other degrading forces external to device 100. Housing 101 may include one or more walls 120 that define a cavity 103 within which various electronic components of device 100 can be disposed. Housing openings 151 may also allow certain fluids (e.g., air) to be drawn into and discharged from cavity 103 of electronic device 100 for helping to manage the internal temperature of device 100. Housing 101 can be constructed from a variety of materials, such as metals (e.g., steel, copper, titanium, aluminum, and various metal alloys), ceramics, plastics, and any combinations thereof.

Rather than being provided as a single enclosure, housing 101 may also be provided as two or more housing components. Processor 102, memory 104, power supply 106, communications circuitry 108-1, input component 110, and cooling component 118 may be at least partially contained within a first housing component 101a, for instance, while output component 112 may be at least partially contained within a second housing component 101b.

With respect to a power module assembly, the composition may be disposed on a surface of a power module. For instance, a power module assembly is provided, which comprises a power module having at least two surfaces, and a composition comprising a plurality of encapsulated phase change material particles dispersed within a matrix disposed upon at least a portion of one of the surfaces.

EXAMPLES

The constituents listed in Table 1 below were placed in a vessel with stirring to form a mixture.

TABLE 1

| Constituents | Sample Nos./Amt (wt %) | | | | | | | |
|---|---|---|---|---|---|---|---|---|
| | 1 | 2 | 3 | 4 | 5 | 6 | 7 | 8 |
| COVINAX 331 Acrylic emulsion$ | 66 | 66 | 66 | | 60 | | | |
| GELVA GME 3011✓ | | | | 66 | | 60 | | |
| DUROTAK 151A# | | | | | | | 66 | |
| DUROTAK 1068* | | | | | | | | 66 |
| MPCM-32 | 34 | | | | | | | |
| MPCM-37 | | 34 | | 34 | | | 34 | 34 |
| MPCM-52 | | | 34 | | | | | |
| Silver Coated MPCM-37 | | | | | 40 | 40 | | |

$COVINAX 331-00 is available commercially from Franklin Adhesives and Polymers and is described as a surfactant stabilized acrylic copolymer, which was developed for permanent pressure sensitive applications requiring high tack and peel strength. According to the manufacturer, COVINAX 331-00 exhibits excellent adhesion to corrugated board, polyolefin films and most types of foams; forms permanent bonds whether at room temperature or refrigerator temperatures; and its wide adhesion range allows it to be used in a variety of different applications, including all temperature grade labels.
✓GELVA GME 3011 is a solution rubber based PSA and is available from Henkel Corporation.
DUROTAK 151A is a solution acrylic pressure sensitive adhesive designed for applications requiring rapid wet-out and high tack on low energy surfaces. The reported physical properties include: tack (in ozf/in) (81), peel strength (in ozf/in): from stainless steel after 20 minutes (85), 24 hours (96), one week at room temperature (96), one week at 158° F. (115), and one week at 95° F./95% RH (105), and from HDPE after 20 minutes (45) and after 24 hours (47), and shear strength at 72° F. after 1 hour (10) (4.4 psi)
*DUROTAK 1068 is a solution acrylic pressure sensitive adhesive designed for general purpose transfer film and high heat applications. The reported physical properties include: tack (in ozf/in) (45), peel strength (in ozf/in): from stainless steel after 20 minutes (60), 24 hours (78), one week at room temperature (94), one week at 158° F. (145), and one week at 95° F./95% RH (110), and from HDPE after 20 minutes (13) and after 24 hours (20), and shear strength at 72° F. after 1 hour (11) (8.8 psi)

MPCM materials were purchased from Microtek Laboratories. The materials have a core of one or material(s) that melts at the given temperature (in ° C.). For instance, MPCM-32 is a special blend, whereas MPCM-37 is n-eicosane. Silver Coated MPCM-37 has a silver coating that is about 1 μm thick Each mixture was stirred for a period of time of 60 minutes to disperse the encapsulated phase change materials and form the numbered samples.

Figure 6A:
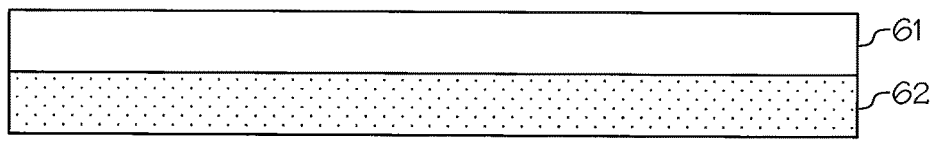
FIGS. 6A-B shows a representation of the compositional layers of a thermal absorbing film, where (A) a composition including a matrix within which is dispersed a plurality of encapsulated phase change material particles (61) is placed in contact with a conductive support (62) and (B) a composition including a matrix within which is dispersed a plurality of metal-coated encapsulated phase change material particles (63) is placed in contact with a conductive support (64), to form an EMI shielding thermal absorbing film.
Figure 6B:
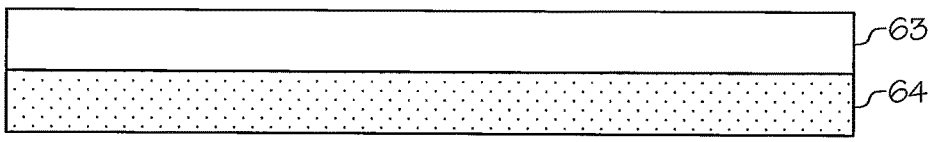

A 0.03 mm coating of each sample coated on 25 um thick graphite film as illustrated in FIGS. 6A-B. The composite sample was placed on a test die, and exposed to a temperature of 50° C. to produce a temperature drop of 6-8° C. A composition prepared in a similar manner though without the encapsulated phase change materials and likewise placed on a test die produced a temperature drop of about 2-3° C.

Figure 7:
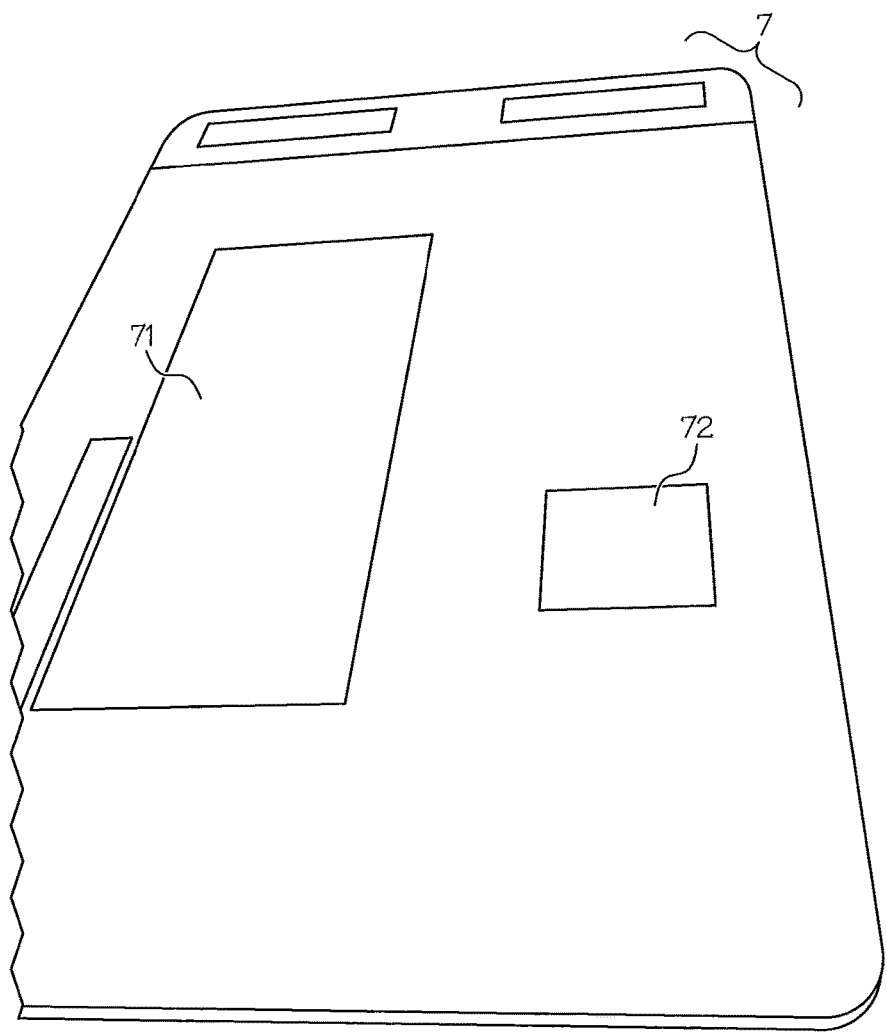
FIG. 7 depicts a top view within the housing of a tablet of a power module under which the inventive composition (not shown) is disposed.

In Table 2 below, Sample Nos. 1-8 were placed at the top of the CPU location shown on a tablet in FIG. 7, and the following measured properties were recorded and are listed in the leftmost column. Reference to FIG. 7 shows such a power module 71 within the interior of a tablet 7 and a CPU 72 in proximity thereto. The values shown are the CPU temperature and highest skin temperature. The values for Sample Nos. 1-8 are presented.

One set of controls used a graphite heat spreader and another set of controls was disposed directly on the tablet computer processing unit.

TABLE 2

| Physical Properties | Sample Nos. | | | | | | | |
|---|---|---|---|---|---|---|---|---|
| | 1 | 2 | 3 | 4 | 5 | 6 | 7 | 8 |
| Solids, % | 70.3 | 70.3 | 70.3 | 73.6 | 73 | 73 | 70 | 70 |
| PCM melting point, ° C. | 32 | 37 | 52 | 37 | 37 | 37 | 37 | 37 |
| Heat of fusion, J/cc | 55 | 75 | 70 | 60 | 108 | 110 | 95 | 90 |
| Peel Adhesion (25 um dry film coated on 50 um Cu foil), lb | 2.5 | 3 | 2.5 | 2.2 | 2.8 | 3 | 2.5 | 2.2 |
| Measured CPU Temperature, ° C. | 72 | 71 | 70 | 72 | 72 | 71 | 71 | 71 |
| Highest Skin temperature, ° C. | 41.8 | 41.5 | 40.0 | 41.8 | 41.0 | 40.6 | 41.2 | 41.5 |

The CPU temperature for each of the two controls—graphite and direct application—was measured at 74° C. and 78° C., respectively. The measurements were taken directly from the tablet itself. Thus, a dramatic reduction—as high as about 11%—may be realized.

The measured skin temperature for each of the two controls, graphite and nothing, was 42° C. and 45° C. Each of Sample Nos. 1-8 performed better than the control graphite heat spreader, which was approximately 10% better than with no heat spreader at all.

What is claimed is:

1. A consumer electronic article of manufacture comprising:
   a housing comprising at least one housing substrate having an interior surface and an exterior surface;
   a combination comprising a composition and a substrate on which the composition is disposed, the composition comprising a matrix and encapsulated phase change material particles dispersed therein, wherein:
   the matrix comprises a pressure sensitive adhesive or an acrylic emulsion,
   the encapsulated phase change material has a melting point in the range of about 30° C. to about 100° C.,
   the composition comprises:
      about 10 to about 80% by volume of the matrix and about 20 to about 90% by volume of the encapsulated phase change material,
   the substrate is selected from the group consisting of a metallic, a metal-coated polymeric, a graphite or a metal-coated graphitic substrate, on which the composition is disposed, and wherein the combination is disposed on at least a portion of the interior surface of the at least one housing substrate; and
   at least one semiconductor package comprising an assembly comprising at least one of
   I.
      a semiconductor chip;
      a heat spreader; and
      a thermal interface material therebetween, or
   II.
      a heat spreader;
      a heat sink; and
      a thermal interface material therebetween.

2. The article of claim 1, further comprising a venting element to disperse generated heat from the semiconductor assembly from the article.

3. The article of manufacture of claim 1, wherein the housing comprises at least two substrates.

4. The article of manufacture of claim 1, wherein the housing comprises a plurality of substrates.

5. The article of manufacture of claim 1, wherein the substrates are dimensioned and disposed to engage one another.

6. The article of manufacture of claim 1, wherein the composition is disposed on at least a portion of the interior surface of the at least one housing substrate, the complementary exterior surface of which comes into contact with the end user when in use.

7. The article of manufacture of claim 1, wherein the composition further comprises thermally insulating materials.

8. The article of manufacture of claim 7, wherein the thermally insulating materials in the composition comprise a gas.

9. The article of manufacture of claim 7, wherein the thermally insulating materials in the composition comprise air.

10. The article of manufacture of claim 7, wherein the thermally insulating materials in the composition comprise a gas within a hollow sphere-like vessel.

11. The article of manufacture of claim 7, wherein the thermally insulating materials are used at a concentration within the range of 25% to 99% by volume in the composition.

12. The article of manufacture of claim 1, wherein the composition facilitates the transfer of heat from an electronic component to a heat sink.

13. The article of manufacture of claim 1, wherein the thermal interface material has a melting point of approximately 37° C.

14. The article of manufacture of claim 1, wherein the encapsulated phase change material has a melting point of approximately 37° C.

15. The article of manufacture of claim 1, wherein the thermal interface material has a melting point of approximately 52° C.

16. The article of manufacture of claim 1, wherein the encapsulated phase change material has a melting point of approximately 52° C.

17. The article of manufacture of claim 1, wherein the article is a notebook personal computer, tablet personal computer or a handheld device.

* * * * *